United States Patent [19]
Kukino et al.

[11] Patent Number: 5,700,551
[45] Date of Patent: Dec. 23, 1997

[54] LAYERED FILM MADE OF ULTRAFINE PARTICLES AND A HARD COMPOSITE MATERIAL FOR TOOLS POSSESSING THE FILM

[75] Inventors: Satoru Kukino; Tetsuo Nakai; Mitsuhiro Goto; Takashi Yoshioka; Makoto Setoyama, all of Hyogo, Japan

[73] Assignee: Sumitomo Electric Industries, Ltd., Osaka, Japan

[21] Appl. No.: 529,840

[22] Filed: Sep. 18, 1995

[30] Foreign Application Priority Data

Sep. 16, 1994 [JP] Japan .................. 6-248503

[51] Int. Cl.$^6$ .................. C23C 14/06; B23B 27/00
[52] U.S. Cl. .................. 428/212; 428/216; 428/336; 428/698; 428/701; 428/702; 428/704; 51/307; 51/309; 427/419.1; 427/419.2; 427/419.7
[58] Field of Search .................. 428/698, 212, 428/216, 336, 701, 702, 704; 51/307, 309; 427/419.1, 419.2, 419.7

[56] References Cited

U.S. PATENT DOCUMENTS

| | | | |
|---|---|---|---|
| 4,268,569 | 5/1981 | Hale | 428/215 |
| 4,334,928 | 6/1982 | Hara et al. | 75/238 |
| 4,562,163 | 12/1985 | Endo et al. | 501/96 |
| 4,835,062 | 5/1989 | Holleck | 428/469 |
| 4,984,940 | 1/1991 | Bryant et al. | 428/698 |

FOREIGN PATENT DOCUMENTS

| | | |
|---|---|---|
| 0 113 660 | 7/1984 | European Pat. Off. |
| 0 197 185 | 10/1986 | European Pat. Off. |
| 0 310 042 | 4/1989 | European Pat. Off. |
| 0 592 986 | 4/1994 | European Pat. Off. |
| 0 375 155 | 7/1978 | France |
| 2 448 517 | 9/1980 | France |
| 52-43846 | 11/1977 | Japan |
| 53-77811 | 7/1978 | Japan |
| 59-57967 | 4/1984 | Japan |
| 5-80547 | 11/1993 | Japan |

OTHER PUBLICATIONS

Database WPI, Section Ch, Week 8407, "Disposable Hard Tool Tip Multiple Hard Coating Forming Carbide Nitricarbo Nitride Group-IVA Group-VA Group-VIA Element Top Coat Alumina", AN 84-039561, Toshiba Tungallow KK, (Jan. 6, 1984).

Database WPI, Section CH, Week 8337, "Sinter High Speed Machining Tool Contain Molybdenum", Derwent Publications Ltd., AN 83-760769, Nachi Fujikoshi Corp., (Jul. 28, 1983).

Patent Abstracts of Japan, vol. 010, No. 208, (C-361), Jul. 22, 1986, "Tool Coated With Multilayered Hard Film", Japanese 61-048568, Mar. 10, 1986.

*Primary Examiner*—Archene Turner
*Attorney, Agent, or Firm*—Foley and Lardner

[57] ABSTRACT

Ultrafine particle-layered film for coating cutting tools. The film has more than two layers of at least two compounds consisting mainly of carbide, nitride, carbonitride or oxide of at least one element selected from a group consisting of IVa group elements, Va group elements, VIa group elements, Al, Si and B, and that each layer is made of ultrafine particles. Ultrafine particle-layered film improves hardness, strength, wear-resistance and heat-resistance of the tools.

31 Claims, 3 Drawing Sheets

LAYERED FILM MADE OF ULTRAFINE PARTICLES AND A HARD COMPOSITE MATERIAL FOR TOOLS POSSESSING THE FILM

BACKGROUND OF THE INVENTION

1. Field of the Invention

The present invention relates to a layered film made of ultrafine particles ("ultrafine particles-layered film", hereinafter) for coating cutting tools and a composite material for tools possessing the film which are improved in hardness, strength, wear-resistance and heat-resistance.

The present invention is advantageously applicable to cutting tools whose substrate is made of CBN sintered body, diamond sintered body, silicon nitride sintered body, aluminum oxide-titanium nitride sintered body, cemented carbide, cermets or high speed too/steel.

2. Description of the Related Art

Tools of high speed steel and cemented carbide are coated with a thin film of carbide, nitride or carbonitride of titanium so as to improve wear-resistance. In an application where higher hardness and higher strength at elevated temperatures are required, tools made of sintered body such as cubic boron nitride (CBN) sintered body, diamond sintered body, silicon nitride sintered body and aluminum oxide-titanium carbide are used.

However, heat-resistance and wear-resistance of known tools are becoming insufficient for recent requirement, so that known cutting tools are difficult to be used in sever cutting conditions including high speed cutting and high performance cutting.

An object of the present invention is to improve wear-resistance, heat-resistance and corrosion-resistance of cutting tools, wear-resisting tools, sliding parts or machine parts.

Another object of the present invention is to provide a hard composite material for tools, which possesses higher strength of base material and is improved in wear-resistance, hardness at elevated temperatures and corrosion-resistance, and which can be used in cutting work of hardened steels, high-grade high-hard cast iron or other materials which are difficult to be cut.

SUMMARY OF THE INVENTION

The present invention provides ultrafine particle-layered film, characterized in that the film has more than two layers, each layer is made of a compound consisting mainly of carbide, nitride, carbonitride or oxide of at least one element selected from a group comprising IVa group elements, Va group elements, VIa group elements, Al, Si and B, and each layer is made of ultrafine particles.

The present invention provides also a hard composite material for tool coating, characterized in that the tool has the ultrafine particle-layered film on at least a portion of a surface of substrate of tool where cutting is effected.

The ultrafine particle-layered film according to the present invention is based on a novel idea and is different from known concepts. Therefore, the ultrafine particle-layered film and the hard composite material for tool coating according to the present invention will be explained with referring to FIG. 1 and 2.

BRIEF DESCRIPTION OF THE DRAWINGS

FIG. 1 illustrates a cross sectional view of a hard composite material for tool coating according to the present invention. The hard composite material comprises a ultra fine particle-layered film (1) consisting of unit layers (a) and (b) deposited alternatively and repeatedly on a substrate (2). An intermediate layer (3) and a surface layer (4) can be formed optionally. Each layer (a) or (b) of the ultrafine particle-layered film is emphasized in FIG. 1 but its actual thickness is 1 nm to 100 nm, more preferably 1 nm to 50 nm, and more preferably 1 nm to 10 nm which is about 1/100 of thickness of the intermediate layer (3) which is 0.05 μm to 5 μm thick and thickness of the surface layer (4) which is 0.1 μm to 5 μm thick respectively.

FIG. 2 is an illustrative enlarged cross section of the ultrafine particle-layered film (1). As is seen in FIG. 2, each layer (a) and (b) of the ultrafine particle-layered film (I)consists of ultrafine particles. In FIG. 2, "$d_1$" and "$d_2$" are particle sizes of particles for each layer (a) and (b). A graph shown at fight side of FIG. 2 illustrates a variation in composition in the ultrafine particle-layered film along the thickness direction. One can understand that proportions of elements in two layers "a" (solid line) and "b" (dotted line) are repeated alternately along the thickness direction.

The ultrafine particle-layered film according to the present invention have preferably at least one layer made of a compound whose crystal structure is cubic system and at least another one layer made of a compound whose crystal structure is not cubic system and/or is amorphous. The compound of non-cubic system is preferably compounds whose crystal structure is hexagonal system.

The compound whose crystal, structure is cubic system is preferably nitride, carbide or carbonitride containing at least one element selected from a group comprising Ti, Zr, Cr, V, Hf, Al and B. The compound whose crystal structure is not cubic system or of amorphous is preferably nitride, carbide or carbonitride containing at least one element selected from a group comprising Al, Si and B, in particular aluminium nitride (AlN).

Particle size of each layer can be nearly equal to a thickness of each layer and/or can be different in two layers. Alignment of the lattices of adjacent particles is not specially required.

Each layer of the ultrafine particle-layered film according to the present invention can be a composition modulated layer in which composition change gradually and continuously between adjacent two layers or can has a mixed layer of adjacent two layers.

Figure 3:
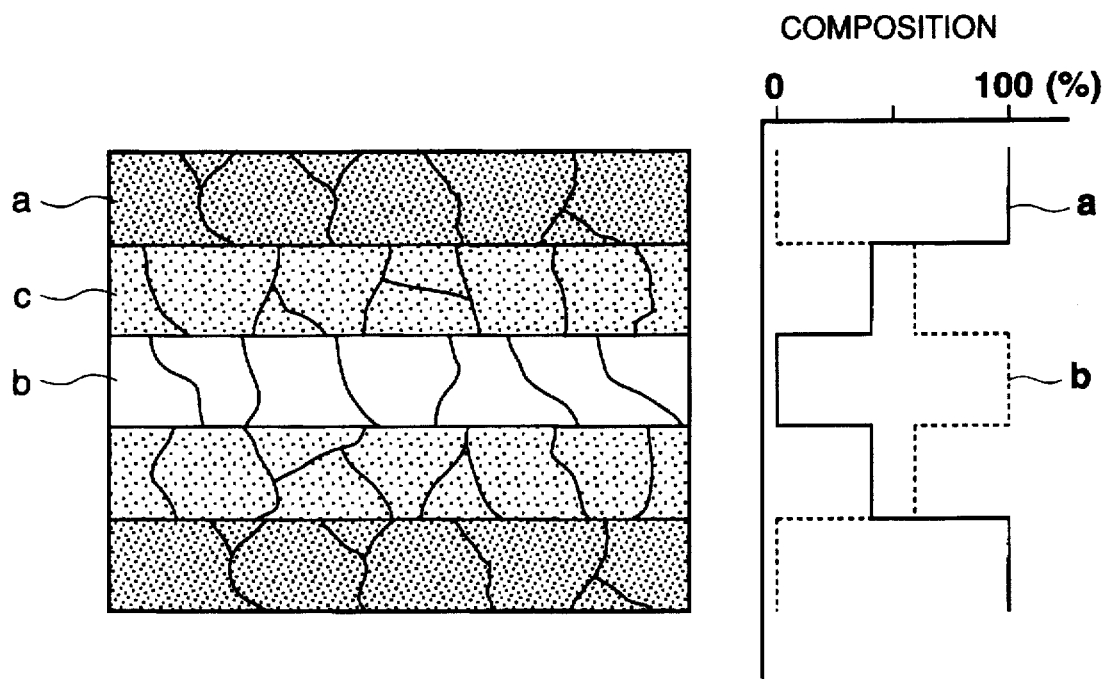
FIG. 3 is a view similar to FIG. 2 but the ultrafine particle-layered film has a composition modulated layer.
Figure 4:
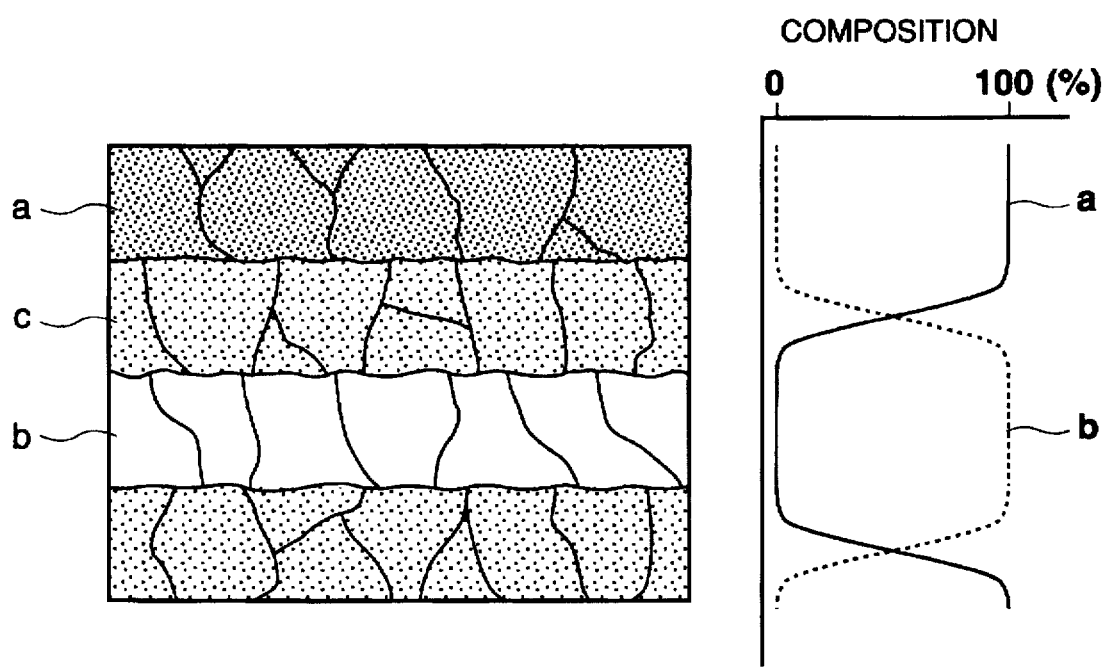
FIG. 4 is a view similar to FIG. 2 but the ultrafine particle-layered film has a mixed layer.

FIG. 3 and FIG. 4 illustrate structures of the ultrafine particle-layered film having the composition modulated layer and the mixed layer respectively. The composition modulated layer or the mixed layer (c) is interposed between adjacent layers (a) and (b), The compound from which each layer of the ultrafine particle-layered film is made can consist of different elements or can contain common element(s). For example, two layers can be TiC and AlN or can be $(Ti_xAl_{1-x})N$ and $(Ti_yAl_{1-y})N$ in which $0 \leq x, y \leq 1$ and $x \neq y$.

The ultrafine particle-layered film can consist of two compounds repeated alternately or of more than three compounds repeated successively. Preferably, at least one compound is a compound having mainly metallic bond property and at least another one compound is a compound having mainly covalent bond property. For example, preferably, the former is TiN and the later is AlN.

Figure 2:
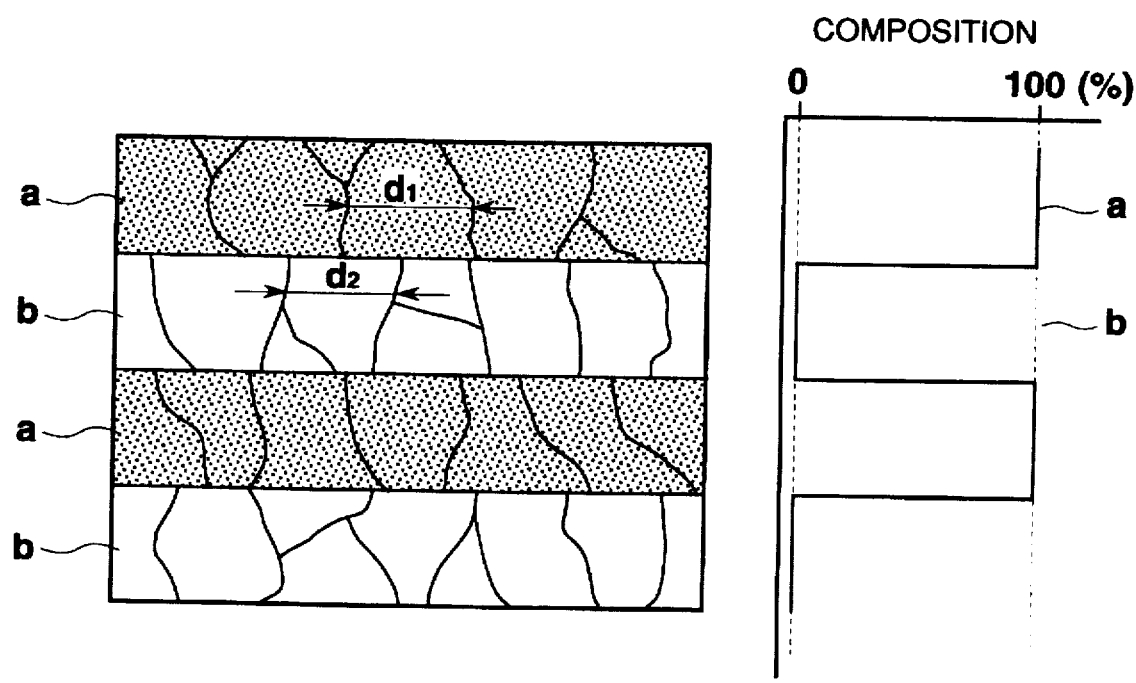
FIG. 2 is an enlarged illustrative cross sectional view of a ultrafine particle-layered film according to the present invention.

Lamination cycle can be maintained at a constant value or can be changed regularly or irregularly, if necessary. "Lamination cycle" is a distance between one layer and next layer of the same compound (a). In case of FIG. 2, the lamination cycle is a repeating unit of successive two layers (a) and (b) and is a sum $\lambda$ of their thickness [$\lambda=(a)+(b)$].

Figure 1:
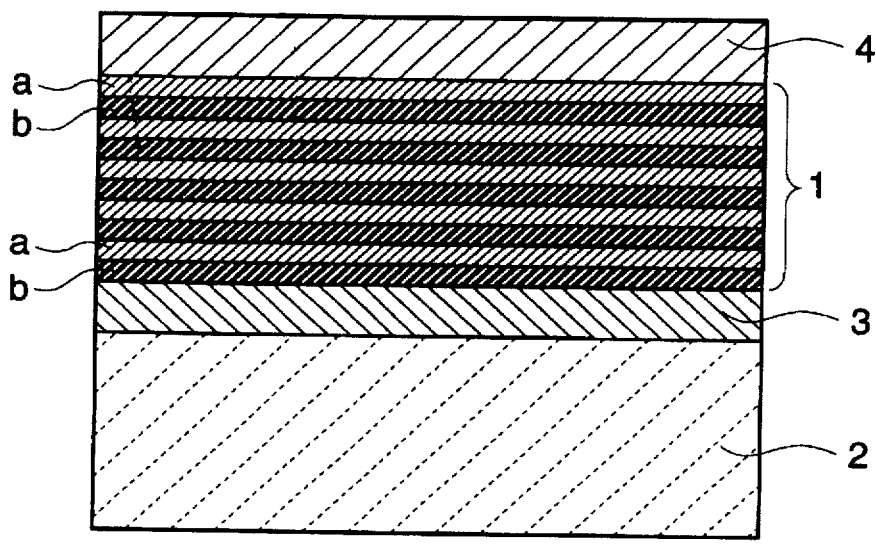
FIG. 1 is an illustrative cross sectional view of a hard composite material for tool coating including a ultrafine particle-layered film according to the present invention.

The optimum ratio of unit layers in thickness (for example, a ratio of thickness of (a) to (b) of FIG. 1) depends on combination of compounds and properties required in the ultrafine particle-layered film. Generally, the ratio is within 1:10 to 10:1.

The ultrafine particle-layered film can be prepared by physical vapour deposition (PVD) technique such as sputtering and ion-plating which permits to perform surface-treatment of substrate or tool without deteriorating its inherent strength and high-resistances to wear and breakage. In PVD, arc-ion plating which can highly ionize material elements is preferably used. The arc-ion plating technique permits to increase adhesion to the substrate and to improve crystallinity of a film deposited.

In particular, reactive PVD technique is preferably used. In fact, higher ionization rates can be obtain by the reactive PVD technique in which a target or plural targets of metal or alloy containing at least one elements selected from IVa, Va, VIa elements, Al, Si and B is used together with a gas containing at least one of C, N and O as materials. Other gas than material gas, such as inert gas of Ar and He and etchant gas of $H_2$ can be introduced into a film-forming chamber.

When the ultrafine particle-layered film according to the present invention is applied to cutting tools, in particular to cutting tips, it is preferable to coat face and flank of the tip with different ultrafine particle-layered films possessing different lamination cycles which depend to properties required in face and flank respectively.

Figure 5:
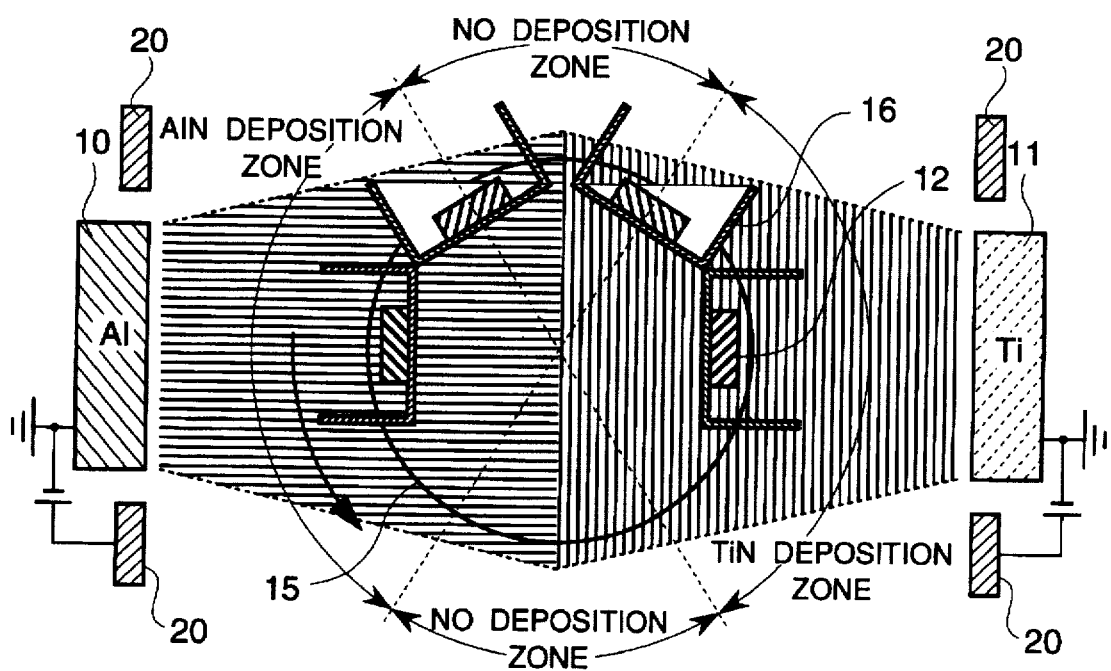
FIG. 5 illustrates first embodiment of an apparatus for preparing the ultrafine particle-layered film according to the present invention.

FIG. 5 is an illustrative view of first embodiment of an apparatus for producing the ultrafine particle-layered film according to the present invention. In this embodiment, each substrate (12) such as tool or tip is held on a periphery of a rotary holder (15). While the rotary holder (15) is rotated, vapor of Al and Ti are created from two vapour sources (10, 11) and also are discharge is created by an arc electrode (20) in nitrogen gas atmosphere so that ultra thin films of AlN and TiN are deposited alternately on a surface of the substrate (12). In this embodiment, a shade or mask (16) is used so as to produce a ultrafine particle-layered film having substantially no composition modulated layer (a/b/a/ - - - ). Or, a ultrafine particle-layered film (1) (FIG. 1) having a distribution in composition shown in the right side of FIG. 2. is formed on the substrate (2).

Figure 6:
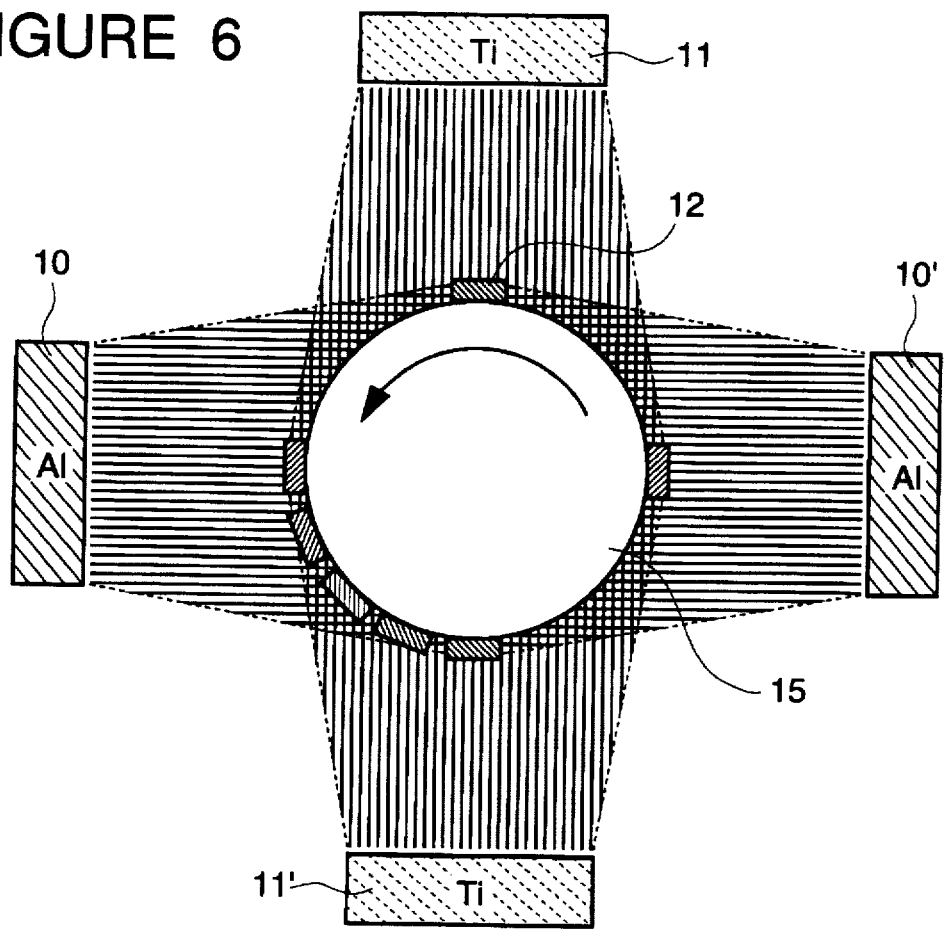
FIG. 6 illustrates second embodiment of the apparatus for preparing the ultrafine particle-layered film according to the present invention.

FIG. 6 is an illustrative view of second embodiment of the apparatus for producing the ultrafine particle-layered film according to the present invention. This second embodiment differs from the first embodiment in that composition modulated layers (c) can be formed in this case. In fact, four vapour sources (10, 10', 11, 11') of Al and Ti surround the rotary holder (15) so that the composition modulated layers (c) are formed at zones where both vapor of Ti and Al arrive to produce a nitride of Ti and Al. FIG. 3 and FIG. 4 illustrate ultrafine particle-layered films obtained by this embodiment and each graph shown at the right side of these figures shows a distribution in components of the resulting ultrafine particle-layered film.

At least one intermediate layer (3) having a thickness of 0.05 μm to 5 μm is preferably interposed between the substrate (2) and the ultrafine particle-layered film (1). This intermediate layer (3) is preferably made of a material selected from a group comprising boride, nitride, carbide and oxide of IVa, Va and VIa elements and their solid solutions. The intermediate layer (3) functions to increase adhesion between the ultrafine particle-layered film (1) and the substrate (2). Such intermediate layer is expected to reduce residual stress in the film deposited on a substrate which differs from the film in its property by assuring gradual control of its properties.

A surface layer (4) having a thickness of 0.1 μm to 5 μm can be deposited on an outer surface of the ultrafine particle-layered film (1). The surface layer (4) is preferably made of a material selected from a group comprising nitride, carbide, carbonitride and oxide of IVa, Va and VIa elements.

Nitride, carbide, carbonitride and oxide of IVa, Va and VIa elements are very hard so that they are expected to be used as wear-resisting coating materials. The present invention is characterized in that at least two compounds are deposited alternately in a form of ultrafine particle-layered film consisting of a plurality layers each having a thickness of nanometer order and consisting of fine particles possessing particle size of nanometer order. The ultrafine particle-layered film shows improved strength, wear-resistance, tenacity and resistance to breakage.

According to the present invention it is believed that by laminating more than two compounds each having different mechanical properties such as elastic constants and Poisson's ratios and each consisting of fine particles having particle sizes of nanometer order so that each layer has a thickness of nanometer order, resistance to propagation of dislocation in each layer can be increase, or dislocation is prevented, or dislocation which propagate between adjacent layers or adjacent particles can be arrested at interface of adjacent layers and/or at grain boundary, so that plastic deformation of the film can be decreased. Development of crack can be arrested at the interfaces so that fracture-resistance of the film is improved.

Advantages of the present invention can not be obtained when the thickness of each layer is not higher than 1 nm, because a stratified structure disappears. It is also confirmed that the advantages of the present invention can not be obtained even if diffusion of consistent elements is reduced to very low level if the thickness is not higher than 1 nm. On the contrary, if the thickness of each layer exceeds 50 nm, the effect to prevent dislocation is lost. Therefore, the thickness of each layer must be in a range of 1 nm to 50 nm.

Still more, if the particle size of particles of which each layer is made is not higher than 1 nm, structure of each particle becomes very unstable and a particulate structure disappears due to diffusion, or the particles size increases due to recombination of adjacent particles so that the resulting particle has a particle size of higher than 1 nm. Remarkable advantage in wear-resistance is not recognized even if fine particles having particle sizes of lower than 1 nm are produced. On the contrary, if the particle size exceeds 50 nm, the effects to prevent dislocation and crack is lowered. Therefore, it is preferable to select the particle size of each particle in a range of 1 nm to 50 nm.

There is no special limitation in a relation between the thickness of each layer and the particle size. However, excessive growth of a particle over a thickness result in disorder of stratified structure. Therefore, the maximum particle size is preferably the same value as the thickness, is at most about 1.1 times of the thickness or less.

Japanese patent laid-open No. 5-80547 discloses a multi-layered protective film or fine particle dispersion film. In this patent, however, the protective film must have an interface which is coherent to lattices of crystals. In the present invention, the above-mentioned advantages can be realized only when two of the stratified structure and the ultrafine particle structure are realized simultaneously. In other words, the above-mentioned advantages can not be obtained by one of the stratified structure an-d the ultrafine particle structure alone.

Still more, in the present invention, coherency to lattices of crystals at interface is not required and, in some eases, there is such danger that advantages of the present invention are lost if an interface between particles in a layer is coherent. In other words, the present invention is different from the idea disclosed in Japanese patent laid-open No. 5-80547 in which existence of coherent interface is indispensable.

Therefore, the ultrafine particle-layered film according to the present invention is advantageously formed on a tool having a substrate made of CBN sintered body, diamond sintered body, silicon nitride sintered body, aluminium oxide-titanium carbide sintered body cemented carbide, cermets or high speed steel at least a portion where cutting is effected, so as to improve wear-resistance, machinability and fracture-resistance and to increase tool life.

The above-mentioned advantages become remarkable when one layer to be stratified has a crystal structure of cubic system and another layer has a crystal structure of other than the cubic system and/or is amorphous due to their mechanical properties or anisotropy in mechanical properties caused by anisotropy in crystal structure. The crystal structure other than the cubic system is preferably hexagonal.

Nitride, carbide and carbonitride of Ti, Zr, Cr, V or Hf have a crystal structure of cubic system and possess improved hardness, heat-resistance, resistance to oxidation and chemical resistance. Therefore, these materials are suitable to prepare the ultrafine particle-layered film according to the present invention. Nitride, carbide and carbonitride of their alloys or alloy with Al are suitable because it is known that they are better in the above-mentioned properties. Cubic boron nitride (CBN) which is a nitride of B is the hardest material next to diamond and possesses higher heat-resistance and oxidation-resistance than diamond. It is easily estimated that alloy compounds between these compounds and B also may possess superior properties. Therefore, these materials also are suitable to prepare the ultrafine particle-layered film according to the present invention As the compound whose crystal structure is not cubic system or amorphous, carbide, nitride or carbonitride of Al, Si or B show improved hardness, chemical stability and heat-resistance. In particular. AlN possessing hexagonal crystal structure is suitable to combined with the metallic bond compound having cubic system since AlN is improved in the above-mentioned properties and possess covalent bond property. AlN has Wurtzite type structure under an equilibrium eonctition at ambient temperature and pressure but has NaCl type structure at elevated pressure. It is reported treat Wurtzite type (hexagonal system) AlN has a property to produce an inclined wave without creating shock wave when it is compressed with impact, resulting in that the ultrafine particle-layered film according to the present invention can be protected from impact damage and hence wear-resistance and breakage-resistance are advantageously improved.

Preferred compound is nitride of Ti and Al and in particular $Ti_xAl_{1-x}N$ ($x>0.25$) having cubic structure and $Ti_yAl_{1-y}N$ ($y \leq 0.25$) having hexagonal structure Compounds improved in oxidation-resistance and chemical stability of the above-mentioned compounds, by adding a small amount of rare earth elements such as yttrium or oxygen, provided that their crystal structure and properties are not influenced badly, are also suitable to improve the properties of the ultrafine particle-layered film according to the present invention.

When separation of adjacent layers occur at the interface between adjacent two layers where mechanical properties change, it is preferable to interpose, between adjacent two layers, a composition modulated layer in which composition changes gradually and continuously or a mixed layer in which compounds of adjacent layers are mixed. This solution improves resistance to separation and reduces wear caused by micro flaking.

Therefore, the ultrafine particle-layered film according to the present invention permits to improve wear-resistance, oxidation-resistance, fracture-resistance and resistance to welding and to increase tool life for tools having a substrate made of cemented carbide, cermets and high speed steel.

It is known that hardness of a thin film is influenced by the hardness of a substrate on which the tin film is deposited and this influence become accelerated greatly with decrement of thickness of the thin film, so that the hardness of thin film approach to the hardness of substrate. Therefore, it is preferable to use a substrate made of CBN sintered body, diamond sintered body, silicon nitride sintered body or aluminium oxide-titanium carbide sintered body which possesses very high hardness at elevated temperatures, so as to maintain high hardness and to improve wear-resistance of the ultrafine particle-layered film according to the present invention at elevated temperature.

In the hard composite material for tools according to the present invention, if the thickness of the ultrafine particle-layered film is not higher than 0.5 μm, no improvement in adhesion is observed. On the contrary, if the thickness of the ultrafine particle-layered film exceeds 15 μm, adhesion to the substrate become lower because of influence of residual stress in the ultrafine particle-layered film and advantage of the ultrafine particle-layered film can not be expected so that wear-resistance become lower. Therefore, the thickness of the ultrafine particle-layered film is preferably in a range of 0.5 μm to 15 μm. Improvement in adhesion of the intermediate layer (3) is not observed when the thickness thereof is not higher than 0.05 μm and exceeds 5 μm. Therefore, the thickness of the intermediate layer (3) is preferably selected in a range between 0.05 and 5 μm from the view point of productivity. The thickness of the surface layer (4) formed on the ultrafine particle-layered film according to the present invention is preferably in a range between 0.1 μm and 5 μm. Improvement in wear-resistance is not observed in a thickness of not higher than 0.1 μm. Thickness of more than 5 μm also show no improvement in wear-resistance due to peel-off or other reasons.

The hard composite material for tools according to the present invention can be shaped or machined into and advantageously used as cutting tools such as tip, drills and end mills. It was confirmed that tools prepared from the hard composite material for tools according to the present invention show surprisingly superior cutting performance and long lives.

In a cutting tip, it is confirmed that the cutting performance and life of the cutting tip increase remarkably when the lamination cycle of the ultrafine particle-layered film at the face is bigger than the lamination cycle at the flank. In a different tip having a different shape and application, the cutting performance and life of the cutting tip increase remarkably when the lamination cycle at the flank is bigger than the lamination cycle at the face. This means that required properties such as wear-resistance and acid-resistance for the face and flank are depend to applications and optimum lamination cycle may be different from each other.

The substrate (2) can be selected from following preferable three CBN sintered bodies (1) to (3):

(1) CBN sintered article containing 30 to 90% by volume of cubic boron nitride (CBN), reminding parts being a binder consisting of at least one member selected from a group comprising nitride, carbide, boride and oxide of IVa, Va and VIa elements and their solid solutions and aluminium compound, and inevitable impurities. The binder consist preferably of 50 to 98% by weight of at least one member selected from a group comprising TiC, TiN, TiCN, (TiM)C, (TiM)N and (TiM)CN in which M is a transition metal selected from IVa, Va nd VIa elements except Ti and 2 to 50% by weight of aluminium compound.

(2) CBN sintered body containing 40 to 95% by volume of cubic boron nitride (CBN), reminding parts being at least one binder selected from a group comprising TiN, boride and carbide of Co or W, aluminum nitride, aluminum boride and their solid solutions and inevitable impurities. The binder contains preferably 1 to 50% by weight of TiN.

(3) CBN sintered body containing more than 90% by volume of CBN crystalline particles, reminding parts being a binder consisting of boronitride of Ia or IIa elements and TiN and inevitable impurities. The binder contains preferably 1 to 50% by weight of TiN. CBN sintered body of the type (1) itself is known and its properties and its production method are described in details in the Japanese patent publication-A-53-77811.

CBN sintered body of the type (2) can be prepared by adding TiN to a binder disclosed in the Japanese patent patent publication-B-52-43846. Addition of TiN increase adhesion to the laminated film (1) of the present invention.

CBN sintered body of the type (3) can be prepared by adding TiN to a binder disclosed in the Japanese patent publication-A-59-57967. Addition of TiN increase adhesion to the laminated film (1) in this type CBN sintered body also.

The substrate (2) can be following diamond sintered bodies containing more than 40% by volume of diamond:

(1) a diamond sintered body containing 50 to 98% by volume of diamond, reminding being preferably iron family element and inevitable impurities. The iron family element is preferably Co.

(2) a diamond sintered body containing 60 to 95% by volume of diamond, reminding comprising preferably iron family element, at least one member selected from a group comprising carbide and carbonitride of IVa, Va and VIa elements, WC and inevitable impurities.

(3) a diamond sintered body containing 60 to 98% by volume of diamond, reminding comprising preferably silicon carbide, silicon, WC and inevitable impurities.

The diamond sintered bodies possess particularly, higher strength among known diamond sintered bodies and contain at least one member selected from a group comprising iron family element, carbide and carbonitride of IVa, Va and VIa elements, silicon nitride and silicon. It was confirmed also that these materials are effective to bond the ultrafine particle-layered film to the substrate.

It is preferable to interpose an intermediate layer (3) having a thickness of 0.05 µm and 5 µm and made preferably of a material selected from a group comprising boride, nitride, carbide and oxide of IVa, Va and VIa elements and their solid solutions between the substrate (2) and the ultrafine particle-layered film (1) so as to improve bonding strength.

The substrate (2) can be a silicon nitride sintered body containing 90% by volume of silicon nitride, preferably prepared by the technique of HIP. Reminding of this silicon nitride sintered body comprise at least one member selected from a group comprising aluminum oxide, aluminum nitride, yttrium oxide, magnesium oxide, hafnium oxide, rear earth and inevitable impurities.

Onto the silicon nitride sintered body, an intermediate layer (3) having a thickness of 0.05 µm and 5 µm and made preferably of a material selected from a group comprising boride, nitride, carbide and carbonitride of IVa, Va and VIa elements is deposited, and then the ultrafine particle-layered film can be deposited by using an apparatus shown in FIG. 5 and FIG. 6.

TiN can be added to the silicon nitride sintered body so as to improve adhesion to the ultrafine particle-layered film.

The substrate (2) can be a sintered body made of 20 to 80% by volume of aluminum oxide and 75 to 15% by volume of titanium carbide. Reminding of this sintered body can be oxide of at least one element selected from a group comprising Mg, Y, Ca, Zr, Ni and Ti and inevitable impurities. Preferable sintered body comprises 65 to 70% by volume of aluminum oxide and 30 to 25% by volume of titanium carbide, reminding being oxide of Mg, Y or Ca and inevitable impurities.

TiN can be added to the aluminum oxide-titanium carbide sintered body so as to improve adhesion to the ultrafine particle-layered film.

Thus, the hard composite material for tool coating according to the present invention has a layered structure consisting very thin unit layers each consisting of ultrafine particles and which can improve resistances to heat, welding, oxidation, breakage and micro-chipping and improve sliding property, still more, possesses tenacity as well as equal or higher hardness than the conventional hard coats, and can be prepared by PVD technique, so that cutting tools or wear-resisting tools having the hard composite material for tool coating according to the present invention show long tool lives.

The hard composite material for tool coating according to the present invention can be used to sliding parts whose surface is required to be resistant to wear so as to elongate its life in addition to cutting tools and wear-resisting tools.

DESCRIPTION OF THE PREFERRED EMBODIMENTS

The present invention will be described in more details with referring to Examples but the present invention is not limited to these Examples.

In Examples, the thickness of each layer and the particle size of each particle were determined by a transmission electron microscope (TEM), a variation in composition was measured by a micro area energy dispersion type X-ray analyzer (EDX) installed in the transmission electron microscope. The variation in composition can be determined by ESCA or SIMS also.

Crystal structure in the ultrafine particle-layered film was determined from X-ray diffraction pattern and from transmission electron scattering pattern in a micro area by using the transmission electron microscope. The X-ray diffraction pattern was obtained by using Cu target and a diffract meter of nickel filter (Cu-K$\alpha$, $\theta$–2$\theta$).

EXAMPLE 1

On a cutting tip of cemented carbide having a composition of JIS P30 and a shape of ISO SNGN120408, a ultrafine particle-layered film according to the present invention was deposited by ion plating with vacuum are discharge.

As is shown in FIG. 5 or FIG. 6, a plurality of targets 10(10'), 11(11') were set in a vacuum chamber and a plurality of the cutting tips (12) were held on a rotary holder (15) arranged at the center of the targets. Thickness and particle size in each layer and variation in composition were controlled by adjusting revolution number of the rotary holder (15), current density of vacuum discharge (evaporation rate of target materials), position and number of the targets and atmosphere pressure.

In operation, after the vacuum chamber of FIG. 5 or FIG. 6 was evacuated to a pressure of $10^{-5}$ Torr, argon (Ar) gas was introduced to create a pressure of $10^{-2}$ Torr, the tips were heated to 500° C. and a voltage of −1,000 V was applied to the tips to cleaned surface of the tips. After then, argon gas was evacuated. Then, at least one of nitrogen ($N_2$) gas, $CH_4$ gas and Ar gas was introduced at a rate of 200 cc/min in a function of the revolution number of the rotary holder and of time and simultaneously targets of IVa, Va or VIa elements, Al, silicon or their alloys were vaporized and ionized in arc discharge, so that a reaction product between the target materials and N or C in the gas was deposited on the rotating tips when the tips passes through respective targets.

For comparison, the conventional coating films were deposited on tips prepared by the same method (Sample No. 50 to 52). Sample No. 50 was prepared by known CVD technique in which a combination of TiN and $Al_2O_3$ was deposited as a hard coat layer. In Sample No. 51, layers of TiN and TiAlN were coated by known ion plating with vacuum arc discharge technique on the same tip having the same composition and same shape. Sample No. 52 was prepared by known sputtering technique by using two targets of TiC and ZrN.

Table 1 shows ultrafine particle-layered films (Samples No. 1 to 49) prepared as above.

Table 2 shows thickness and particle size of each layer were determined by a transmission electron microscope.

The results of flank wear-resistance tests (continuous cutting and intermittent cutting) of the resulting tips also are summarized in Table 2. The wear-resistance test was effected on following conditions:

|  | continuous cutting | intermittent cutting |
|---|---|---|
| test piece | SCM 435 | SCM 435 |
| cutting velocity (m/min) | 230 | 230 |
| feed (mm/rev) | 0.35 | 0.3 |
| cut depth (mm) | 2 | 1.5 |
| cutting time duration (min) | 15 | 20 |

TABLE 1

| sample | Intermediate layer | | Surface layer | | Wear-resitant layer | |
|---|---|---|---|---|---|---|
| No | material | thickness ($\mu$m) | material | thickness ($\mu$m) | material | thickness ($\mu$m) |
| 1 | none | — | none | — | ultrafine particle-layered film | 3.9 |
| 2 | none | — | none | — | ultrafine particle-layered film | 3.8 |
| 3 | none | — | none | — | ultrafine particle-layered film | 4.1 |
| 4 | none | — | none | — | ultrafine particle-layered film | 4.2 |
| 5 | none | — | none | — | ultrafine particle-layered film | 3.8 |
| 6 | none | — | none | — | ultrafine particle-layered film | 3.7 |
| 7 | none | — | none | — | ultrafine particle-layered film | 3.7 |
| 8 | none | — | none | — | ultrafine particle-layered film | 3.6 |
| 9 | none | — | none | — | ultrafine particle-layered film | 3.6 |
| 10 | none | — | none | — | ultrafine particle-layered film | 4.1 |
| 11 | none | — | none | — | ultrafine particle-layered film | 3.8 |
| 12 | TiN | 0.02 | none | — | ultrafine particle-layered film | 7.2 |
| 13 | TiN | 0.05 | none | — | ultrafine particle-layered film | 6.9 |
| 14 | TiN | 0.1 | none | — | ultrafine particle-layered film | 7.5 |
| 15 | TiN | 0.3 | none | — | ultrafine particle-layered film | 7.5 |
| 16 | TiN | 0.5 | none | — | ultrafine particle-layered film | 7.7 |
| 17 | TiN | 1.0 | none | — | ultrafine particle-layered film | 7.8 |
| 18 | TiN | 2.0 | none | — | ultrafine particle-layered film | 7.6 |
| 19 | TiN | 5.0 | none | — | ultrafine particle-layered film | 8.1 |
| 20 | TiN | 10.0 | none | — | ultrafine particle-layered film | 7.6 |
| 21 | TiN | 0.5 | none | — | ultrafine particle-layered film | 0.2 |
| 22 | TiN | 0.5 | none | — | ultrafine particle-layered film | 0.5 |
| 23 | TiN | 0.5 | none | — | ultrafine particle-layered film | 2.0 |
| 24 | TiN | 0.5 | none | — | ultrafine particle-layered film | 4.0 |
| 25 | TiN | 0.5 | none | — | ultrafine particle-layered film | 8.0 |
| 26 | TiN | 0.5 | none | — | ultrafine particle-layered film | 15.0 |
| 27 | TiN | 0.5 | none | — | ultrafine particle-layered film | 20.0 |
| 28 | TiN | 0.5 | TiCN | 0.05 | ultrafine particle-layered film | 11.1 |
| 29 | TiN | 0.5 | TiCN | 0.1 | ultrafine particle-layered film | 11.2 |

TABLE 1-continued

| sample | Intermediate layer | | Surface layer | | Wear-resitant layer | |
|---|---|---|---|---|---|---|
| No | material | thickness (μm) | material | thickness (μm) | material | thickness (μm) |
| 30 | TiN | 0.5 | TiCN | 0.5 | ultrafine particle-layered film | 11.0 |
| 31 | TiN | 0.5 | TiCN | 1.0 | ultrafine particle-layered film | 11.0 |
| 32 | TiN | 0.5 | TiCN | 3.0 | ultrafine particle-layered film | 11.0 |
| 33 | TiN | 0.5 | TiCN | 5.0 | ultrafine particle-layered film | 10.9 |
| 34 | TiN | 0.5 | TiCN | 10.0 | ultrafine particle-layered film | 10.9 |
| 35 | none | — | none | — | ultrafine particle-layered film | 3.5 |
| 36 | none | — | none | — | ultrafine particle-layered film | 3.1 |
| 37 | none | — | none | — | ultrafine particle-layered film | 3.3 |
| 38 | TiN | — | TiCN | 0.5 | ultrafine particle-layered film | 3.1 |
| 39 | TiN | 0.5 | TiCN | 0.5 | ultrafine particle-layered film | 3.2 |
| 40 | TiN | 0.5 | TiCN | 0.5 | ultrafine particle-layered film | 3.4 |
| 41 | TiN | 0.5 | TiCN | 0.5 | ultrafine particle-layered film | 3.2 |
| 42 | TiN | 0.5 | TiCN | 0.5 | ultrafine particle-layered film | 3.4 |
| 43 | TiN | 0.5 | TiCN | 0.5 | ultrafine particle-layered film | 3.6 |
| 44 | TiN | 0.5 | TiCN | 0.5 | ultrafine particle-layered film | 3.5 |
| 45 | TiN | 0.5 | TiCN | 0.5 | ultrafine particle-layered film | 3.5 |
| 46 | TiN | 0.5 | TiCN | 0.5 | ultrafine particle-layered film | 3.5 |
| 47 | TiN | 0.5 | TiCN | 0.5 | ultrafine particle-layered film | 3.6 |
| 48 | TiN | 0.5 | TiCN | 0.5 | ultrafine particle-layered film | 3.7 |
| 49 | TiN | 0.5 | TiCN | 0.5 | ultrafine particle-layered film | 3.5 |
| 50 | none | | $Al_2O_3$ | 0.5 | TiN | 3.2 |
| 51 | TiN | 0.5 | none | — | TiAlN | 4.0 |
| 52 | none | — | none | — | multi-layered film | 5.0 |

TABLE 2

Wear-resitant layer (structure of ultrafine particle-layered film)

| | materials of each layer | | thickness (nm) | | Maximum partilce size (nm) | | Crystal structure | | Flank wear (mm) | |
|---|---|---|---|---|---|---|---|---|---|---|
| No | (a) | (b) | (a) | (b) | (a) | (b) | (a) | (b) | continuous cutting | off & on cutting |
| 1 | TiN | AlN | 0.8 | 1.0 | 0.8 | 1.0 | cubic | hexagonal | 0.20 | 0.22 |
| 2 | TiN | AlN | 1.0 | 1.0 | 1.0 | 1.0 | cubic | hexagonal | 0.13 | 0.12 |
| 3 | TiN | AlN | 5.2 | 3.1 | 5.2 | 3.1 | cubic | hexagonal | 0.10 | 0.11 |
| 4 | TiN | AlN | 5.1 | 6.1 | 5.1 | 6.1 | cubic | hexagonal | 0.09 | 0.10 |
| 5 | TiN | AlN | 9.8 | 12.1 | 9.8 | 12.1 | cubic | hexagonal | 0.12 | 0.12 |
| 6 | TiN | AlN | 18.0 | 18.1 | 18.0 | 18.1 | cubic | hexagdnal | 0.11 | 0.12 |
| 7 | TiN | AlN | 24.5 | 5.2 | 24.5 | 5.2 | cubic | hexagonal | 0.12 | 0.11 |
| 8 | TiN | AlN | 50.0 | 41.4 | 50.0 | 41.4 | cubic | hexagonal | 0.13 | 0.12 |
| 9 | TiN | AlN | 85.6 | 50.0 | 85.6 | 50.0 | cubic | hexagonal | 0.22 | 0.24 |
| 10 | TiN | AlN | 100.0 | 80.7 | 100.0 | 80.7 | cubic | hexagonal | 0.30 | 0.28 |
| 11 | TiN | AlN | 5.0 | 10.0 | 5.0 | 15.0 | cubic | hexagonal | 0.18 | 0.22 |
| 12 | HfN | AlN | 6.2 | 5.0 | 6.2 | 5.0 | cubic | hexagonal | 0.31 | 0.29 |
| 13 | HfN | AlN | 6.2 | 5.0 | 6.2 | 5.0 | cubic | hexagonal | 0.12 | 0.11 |
| 14 | HfN | AlN | 6.2 | 5.0 | 6.2 | 5.0 | cubic | hexagonal | 0.10 | 0.11 |
| 15 | HfN | AlN | 6.2 | 5.0 | 6.2 | 5.0 | cubic | hexagonal | 0.10 | 0.10 |
| 16 | HfN | AlN | 6.2 | 5.0 | 6.2 | 5.0 | cubic | hexagonal | 0.09 | 0.08 |
| 17 | HfN | AlN | 6.2 | 5.0 | 6.2 | 5.0 | cubic | hexagonal | 0.10 | 0.11 |
| 18 | HfN | AlN | 6.2 | 5.0 | 6.2 | 5.0 | cubic | hexagonal | 0.12 | 0.12 |
| 19 | HfN | AlN | 6.2 | 5.0 | 6.2 | 5.0 | cubic | hexagonal | 0.13 | 0.13 |
| 20 | HfN | AlN | 6.2 | 5.0 | 6.2 | 5.0 | cubic | hexagonal | 0.25 | 0.27 |
| 21 | TiHfN | AlN | 32.0 | 25.9 | 32.0 | 25.9 | cubic | hexagonal | 0.33 | 0.31 |
| 22 | TiHfN | AlN | 32.0 | 25.9 | 32.0 | 25.9 | cubic | hexagonal | 0.13 | 0.12 |
| 23 | TiHfN | AlN | 32.0 | 25.9 | 32.0 | 25.9 | cubic | hexagonal | 0.11 | 0.10 |
| 24 | TiHfN | AlN | 32.0 | 25.9 | 32.0 | 25.9 | cubic | hexagonal | 0.11 | 0.10 |
| 25 | TiHfN | AlN | 32.0 | 25.9 | 32.0 | 25.9 | cubic | hexagonal | 0.10 | 0.10 |
| 26 | TiHfN | AlN | 32.0 | 25.9 | 32.0 | 25.9 | cubic | hexagonal | 0.13 | 0.14 |
| 27 | TiHfN | AlN | 32.0 | 25.9 | 32.0 | 25.9 | cubic | hexagonal | 0.22 | 0.25 |
| 28 | CrN | AlN | 6.2 | 5.0 | 7.0 | 9.1 | cubic | hexagonal | 0.23 | 0.21 |
| 29 | CrN | AlN | 6.2 | 5.0 | 7.0 | 9.1 | cubic | hexagonal | 0.12 | 0.12 |
| 30 | CrN | AlN | 6.2 | 5.0 | 7.0 | 9.1 | cubic | hexagonal | 0.14 | 0.13 |
| 31 | CrN | AlN | 6.2 | 5.0 | 7.0 | 9.1 | cubic | hexagonal | 0.13 | 0.13 |
| 32 | CrN | AlN | 6.2 | 5.0 | 7.0 | 9.1 | cubic | hexagonal | 0.12 | 0.13 |
| 33 | CrN | AlN | 6.2 | 5.0 | 7.0 | 9.1 | cubic | hexagonal | 0.12 | 0.14 |
| 34 | CrN | AlN | 6.2 | 5.0 | 7.0 | 9.1 | cubic | hexagonal | 0.34 | 0.33 |
| 35 | TiAlN* | TiAlN** | 5.0 | 6.0 | 5.0 | 6.0 | cubic | hexagonal | 0.10 | 0.09 |
| 36 | TiCN | TiAlCN | 7.0 | 5.0 | 7.0 | 5.0 | cubic | hexagonal | 0.09 | 0.10 |
| 37 | TiAlN*** | AlN | 4.0 | 8.0 | 4.0 | 8.0 | cubic | hexagonal | 0.09 | 0.09 |

TABLE 2-continued

| | Wear-resitant layer (structure of ultrafine particle-layered film) | | | | | | | | Flank wear (mm) | |
|---|---|---|---|---|---|---|---|---|---|---|
| | materials of each layer | | thickness (nm) | | Maximum partilce size (nm) | | Crystal structure | | continuous | off & on |
| No | (a) | (b) | (a) | (b) | (a) | (b) | (a) | (b) | cutting | cutting |
| 38 | TiN | TiC | 11.0 | 10.0 | 11.0 | 10.0 | cubic | cubic | 0.13 | 0.12 |
| 39 | TiN | CrN | 1.0 | 1.0 | 1.0 | 0.7 | cubic | cubic | 0.24 | 0.27 |
| 40 | TiN | CrN | 10.0 | 7.2 | 10.0 | 7.0 | cubic | cubic | 0.10 | 0.09 |
| 41 | TiN | ZrN | 15.0 | 8.5 | 15.0 | 8.5 | cubic | cubic | 0.15 | 0.14 |
| 42 | CrN | VN | 7.2 | 22.0 | 7.2 | 22.0 | cubic | cubic | 0.16 | 0.15 |
| 43 | TiCN | HfCN | 5.4 | 2.0 | 5.4 | 2.0 | cubic | cubic | 0.10 | 0.11 |
| 44 | HfC | ZrC | 32.0 | 10.0 | 32.0 | 10.0 | cubic | cubic | 0.15 | 0.14 |
| 45 | | | | | | | | | | |
| a | CrN | $Si_3N_4$ | 45.0 | 21.2 | 45.0 | 21.2 | cubic | hexagonal | 0.14 | 0.15 |
| b | TiCN | BN | 12.5 | 15.3 | 12.5 | 15.3 | cubic | amorpyous | 0.12 | 0.13 |
| c | TiCN | CN | 12.8 | 11.0 | 12.8 | 15.3 | cubic | amorpyous | 0.14 | 0.13 |
| d | TiCN | C | 8.5 | 7.7 | 8.5 | 7.7 | cubic | amorpyous | 0.17 | 0.16 |
| e | C | AlN | 9.7 | 7.7 | 9.7 | 7.7 | cubic | hexagonal | 0.15 | 0.16 |
| 46 | TiCrCN | HfAlCN | 2.5 | 7.2 | 2.5 | 7.2 | cubic | cubic | 0.10 | 0.10 |
| 47 | TiN—AlN—AlN—TiAlN | | 15.0 | 20.0 | 12.0 | 20.0 | cubic - | - hexagonal | 0.11 | 0.10 |
| 48 | TiZrN—TiZrCrN—CrN—TiZrCrN | | 23.2 | 5.0 | 15.4 | 5.0 | cubic - | - cubic | 0.10 | 0.11 |
| 49 | HfN | | 8.9 | | 8.9 | | cubic - | | | |
| | HfCrN | | 12.1 | | 12.1 | | | - cubic - | | |
| | | CrN | | 15.0 | | 15.0 | | - cubic | 0.11 | 0.12 |
| 50 | — | — | — | | — | | | — | 0.30 | broken |
| 51 | — | — | — | | — | | | — | 0.35 | 0.30 |
| 52 | TiC | ZrN | 2.0 | 3.0 | — | | pilar growth | | 0.25 | 0.27 |

Note:
TiHfN: $(Ti_{0.7}Hf_{0.3})N$
HfCN: $Hf(C_{0.4}N_{0.6})$
TiAlN*: $(Ti_{0.8}Al_{0.2})N$
TiCrCN: $(Ti_{0.7}Cr_{0.3})(C_{0.1}N_{0.9})$
TiAlN**: $(Ti_{0.1}Al_{0.9})N$
HfAlCN: $(Hf_{0.3}Al_{0.7})(C_{0.1}N_{0.9})$
TiCN: $Ti(C_{0.5}N_{0.5})$
HfCrN: $(Hf_{0.6}Cr_{0.4})N$
TiAlN***: $(Ti_{0.7}Al_{0.3})N$
TiAlCN: $(Ti_{0.5}Al_{0.5})(C_{0.5}N_{0.5})$ The results summarized in Table 1 and Table 2 reveal that the conventional tip (Sample No. 50) whose hard coating layer was prepared by the conventional PVD technique has not sufficient resistance to breakage because its base material deteriorate in tenacity. On the contrary, tips according to the present invention (Sample No. to 49) show superior wear-resistance in both of continuous and intermittent cutting operations and also show improved resistance to breakage since their hard coat layers were prepared by PVD technique which can reserve the tenacity of base material.

The results of Sample No. 1 to 10 reveal that thickness of the ultrafine particle-layered film according to the present invention is preferably in a range of 1 nm to 50 nm. In fact, Sample No. 11 shows lower wear-resistance because the maximum particle size of a AlN particle in its ultrafine particle-layered film was bigger than a thickness of the layer of AlN, so that no clear stratified structure was observed. Sample No. 39 also showed lower wear-resistance because the maximum particle size of particles in CrN layer was only 0.7 nm.

The results of Sample No. 12 to 20 reveal that the optimum thickness of the intermediate layer is 0.05 μm to 5 μm.

The results of Sample No. 21 to 27 reveal that preferable total thickness of the ultrafine particle-layered film is 0.5 μm to 15 μm.

The results of Sample No. 28 to 34 reveal that the optimum thickness of the surface layer is 0.1 μm to 5 μm.

High wear-resistance and breakage-resistance were observed in Sample No. 47 having a composition modulated layer in which proportions of Ti and Al changed continuously interposed between adjacent two layers of TiN and AlN. Same results were observed also in Sample No. 48 having a composition modulated layer in which proportions of TiZr and Cr changed continuously and in Sample No. 49 having a layer of intermediate composition of $Hf_{0.6}Cr_{0.4}N$ between adjacent two layers of HfN and CrN.

EXAMPLE 2

Powder of TiN and powder of aluminium were mixed at a ratio of 80:20 by weight in a pot made of cemented carbide alloy containing balls of the same material to obtain a binder powder. Powder of CBN was mixed with the binder powder at a ratio of 70:30 by volume and the resulting powder mixture was sintered at 1,400° C. under a pressure of 48 kb for 20 minutes in a container of Mo. The resulting sintered article was shaped into a tip for cutting tool.

The ultrafine particle-layered film according to the present invention was deposited on the resulting tip as substrate by the same method as Example 1 (Sample No. 101 to 131).

For comparison, the conventional coating films were deposited on tips prepared by the same method (Sample No. 132 to 135). The results are summarized in Table 3 and Table 4.

In Table 3 and Table 4, star mark (*) indicates examples outside the present invention. For example, Sample No. 101 is outside the present invention because its ultrafine particle-laminated film (total thickness of 5.1 μm) has a layer of TiN (0.8 nm) and of AlN (0.9 nm) and of lamination cycle=1.7 nm.

Sample Nos. 132 to 135 are comparative examples of known cutting tips having the conventional coating layers.

Sample Nos. 132 and 134 each have a hard coat layer of TiCN layer and/or TiN layer prepared on a tip prepared by the same method as above by ion-plating technique under vacuum arc discharge in usual film forming machine.

Sample No. 133 has a hard coat layer of a combination of TiN and $Al_2O_3$ layer prepared on a tip prepared by the same method as above by usual CVD technique.

Wear-resistance of the resulting tips was determined by curing test in which a round steel rod (SUJ2) having a hardness of HRC60 was cut along its periphery at a cutting speed of 150 mm/min, a depth of cut of 0.2 mm, a feed of 0.1 mm per revolution and for 20 minutes in a dry condition to measure a flank wear width (mm). Results are summarized in Table 4.

TABLE 3

| sample | Intermediate layer | | Surface layer | | Wear-resitant layer | |
|---|---|---|---|---|---|---|
| No | material | thickness (μm) | material | thickness (μm) | material | thickness (μm) |
| 101 | none | — | none | — | ultrafine particle-layered film | 5.1 |
| 102 | none | — | none | — | ultrafine particle-layered film | 0.3* |
| 103 | none | — | none | — | ultrafine particle-layered film | 0.6 |
| 104 | none | — | none | — | ultrafine particle-layered film | 5.2 |
| 105 | none | — | none | — | ultrafine particle-layered film | 14.5 |
| 106 | none | — | none | — | ultrafine particle-layered film | 15.8* |
| 107 | none | — | none | — | ultrafine particle-layered film | 5.1 |
| 108 | none | — | none | — | ultrafine Particle-layered film | 5.0 |
| 109 | none | — | none | — | ultrafine particle-layered film | 5.3 |
| 110 | TiN | 0.01* | none | — | ultrafine particle-layered film | 5.2 |
| 111 | TiN | 0.05 | none | — | ultrafine particle-layered film | 5.3 |
| 112 | TiN | 0.5 | none | — | ultrafine particle-layered film | 5.1 |
| 113 | TiN | 1.6 | none | — | ultrafine particle-layered film | 5.4 |
| 114 | TiN | 5.0 | none | — | ultrafine particle-layered film | 5.2 |
| 115 | TiN | 5.5* | none | — | ultrafine paiticle-layered film | 5.0 |
| 116 | TiN | 1.6 | TiN | 0.05* | ultrafine particle-layered film | 5.1 |
| 117 | TiN | 1.6 | TiN | 0.5 | ultrafine particle-layered film | 5.2 |
| 118 | TiN | 1.6 | TiN | 2.2 | ultrafine particle-layered film | 5.2 |
| 119 | TiN | 1.6 | TiN | 14.9 | ultrafine particle-layered film | 5.2 |
| 120 | TiN | 1.6 | TiN | 16.1* | ultrafine particle-layered film | 5.1 |
| 121 | TiN | 1.6 | none | | ultrafine particle-layered film | 5.3 |
| 122 | TiN | 1.6 | none | | ultrafine particle-layered film | 5.2 |
| 123 | TiN | 1.6 | none | | ultrafine particle-layered film | 5.1 |
| 124 | TiN | 1.6 | none | | ultrafine particle-layered film | 5.0 |
| 125 | TiN | 1.6 | none | | ultrafine particle-layered film | 5.2 |
| 126 | TiN | 1.6 | none | | ultrafine particle-layered film | 5.3 |
| 127 | TiN | 1.6 | none | | ultrafine particle-layered film | 5.1 |
| 128 | TiN | 1.6 | none | | ultrafine particle-layered film | 5.1 |
| 129 | TiN | 1.6 | none | | ultrafine particle-layered film | 5.2 |
| 130 | TiN | 1.6 | none | | ultrafine particle-layered film | 5.3 |
| 131 | TiN | 1.6 | none | | ultrafine particle-layered film | 5.3 |
| 132 | TiN | 1.6 | TiN | 2.0 | TiCN coating layer | 4.8 |
| 133 | TiN | 1.6 | TiN | 2.2 | $Al_2O_3$ coating layer by CVD | 1.0 |
| 134 | none | | TiN | 2.1 | none | |
| 135 | none | | none | | none | |

Sample No. 132 to 135 are comparative.

TABLE 4

| | Structure of ultrafine particle-layered film | | | | | | Wear-resistance | |
|---|---|---|---|---|---|---|---|---|
| | materials of each layer | | thickness (nm) | | lamination cycle | maximum partical size | Flank wear | |
| No. | (a) | (b) | (a) | (b) | (nm) | (nm) | (mm) | Evaluation |
| 101 | TiN | AlN | 0.8* | 0.9* | 1.7 | 0.8* | 0.145 | bad |
| 102 | TiN | AlN | 1.2 | 1.3 | 2.5 | 1.3 | 0.182 | bad |
| 103 | TiN | AlN | 1.2 | 1.3 | 2.5 | 1.3 | 0.129 | good |
| 104 | TiN | AlN | 2.5 | 2.4 | 4.9 | 2.5 | 0.120 | good |
| 105 | TiN | AlN | 2.5 | 2.4 | 4.9 | 2.5 | 0.119 | very good |
| 106 | TiN | AlN | 2.5 | 2.4 | 4.9 | 2.5 | 0.131 | not good |
| 107 | TiN | AlN | 18.4 | 18.5 | 36.9 | 18.5 | 0.125 | good |
| 108 | TiN | AlN | 47.8 | 46.2 | 94.0 | 47.8 | 0.129 | good |
| 109 | TiN | AlN | 52.3 | 51.0 | 103.3 | 52.3 | 0.139 | not good |

TABLE 4-continued

<table>
<tr><th colspan="7">Structure of ultrafine particle-layered film</th><th colspan="2"></th></tr>
<tr><th colspan="2">materials<br>of each layer</th><th colspan="2">thickness<br>(nm)</th><th>lamination<br>cycle</th><th>maximum<br>partical size</th><th colspan="2">Wear-resistance<br>Flank wear</th></tr>
<tr><th>No.</th><th>(a)</th><th>(b)</th><th>(a)</th><th>(b)</th><th>(nm)</th><th>(nm)</th><th>(mm)</th><th>Evaluation</th></tr>
<tr><td>110</td><td>TiN</td><td>AlN</td><td>2.5</td><td>2.4</td><td>4.9</td><td>2.5</td><td>0.121</td><td>good</td></tr>
<tr><td>111</td><td>TiN</td><td>AlN</td><td>2.5</td><td>2.4</td><td>4.9</td><td>2.5</td><td>0.115</td><td>very good</td></tr>
<tr><td>112</td><td>TiN</td><td>AlN</td><td>2.5</td><td>2.4</td><td>4.9</td><td>2.5</td><td>0.115</td><td>very good</td></tr>
<tr><td>113</td><td>TiN</td><td>AlN</td><td>2.5</td><td>2.4</td><td>4.9</td><td>2.5</td><td>0.114</td><td>very good</td></tr>
<tr><td>114</td><td>TiN</td><td>AlN</td><td>2.5</td><td>2.4</td><td>4.9</td><td>2.5</td><td>0.116</td><td>very good</td></tr>
<tr><td>115</td><td>TiN</td><td>AlN</td><td>2.5</td><td>2.4</td><td>4.9</td><td>2.5</td><td>0.122</td><td>good</td></tr>
<tr><td>116</td><td>TiN</td><td>AlN</td><td>2.5</td><td>2.4</td><td>4.9</td><td>2.5</td><td>0.115</td><td>very good</td></tr>
<tr><td>117</td><td>TiN</td><td>AlN</td><td>2.5</td><td>2.4</td><td>4.9</td><td>2.5</td><td>0.109</td><td>very good</td></tr>
<tr><td>118</td><td>TiN</td><td>AlN</td><td>2.5</td><td>2.4</td><td>4.9</td><td>2.5</td><td>0.108</td><td>very good</td></tr>
<tr><td>119</td><td>TiN</td><td>AlN</td><td>2.5</td><td>2.4</td><td>4.9</td><td>2.5</td><td>0.119</td><td>very good</td></tr>
<tr><td>120</td><td>TiN</td><td>AlN</td><td>2.5</td><td>2.4</td><td>4.9</td><td>2.5</td><td>0.124</td><td>good</td></tr>
<tr><td>121</td><td>TiN</td><td>AlN</td><td>30.1</td><td>31.5</td><td>61.6</td><td>0.8*</td><td>0.139</td><td>not good</td></tr>
<tr><td>122</td><td>TiN</td><td>AlN</td><td>30.1</td><td>31.5</td><td>61.6</td><td>2.5</td><td>0.126</td><td>good</td></tr>
<tr><td>123</td><td>TiN</td><td>AlN</td><td>30.1</td><td>31.5</td><td>61.6</td><td>31.5</td><td>0.129</td><td>good</td></tr>
<tr><td>124</td><td>TiN</td><td>AlN</td><td>30.1</td><td>31.5</td><td>61.6</td><td>54</td><td>0.139</td><td>not good</td></tr>
<tr><td>125</td><td>ZrN</td><td>AlN</td><td>2.4</td><td>2.6</td><td>5.0</td><td>2.5</td><td>0.121</td><td>good</td></tr>
<tr><td>126</td><td>HfN</td><td>AlN</td><td>2.6</td><td>2.4</td><td>5.0</td><td>2.5</td><td>0.119</td><td>very good</td></tr>
<tr><td>127</td><td>VN</td><td>AlN</td><td>2.4</td><td>2.5</td><td>4.9</td><td>2.5</td><td>0.118</td><td>very good</td></tr>
<tr><td>128</td><td>CrN</td><td>VN</td><td>2.5</td><td>2.6</td><td>5.1</td><td>2.5</td><td>0.124</td><td>good</td></tr>
<tr><td>129</td><td>TiN</td><td>VN</td><td>2.5</td><td>2.6</td><td>5.1</td><td>2.5</td><td>0.125</td><td>good</td></tr>
<tr><td>130</td><td>CrN</td><td>AlN</td><td>2.4</td><td>2.3</td><td>4.7</td><td>2.5</td><td>0.120</td><td>good</td></tr>
<tr><td>131</td><td colspan="2">TiN (2.4)/AlN (2.3)/CrN (2.4)</td><td></td><td></td><td>7.1</td><td>2.5</td><td>0.124</td><td>good</td></tr>
<tr><td>132</td><td>—</td><td>—</td><td>—</td><td>—</td><td>—</td><td>—</td><td>0.151</td><td>bad</td></tr>
<tr><td>133</td><td>—</td><td>—</td><td>—</td><td>—</td><td>—</td><td>—</td><td>0.154</td><td>bad</td></tr>
<tr><td>134</td><td>—</td><td>—</td><td>—</td><td>—</td><td>—</td><td>—</td><td>0.198</td><td>bad</td></tr>
<tr><td>135</td><td>—</td><td>—</td><td>—</td><td>—</td><td>—</td><td>—</td><td>0.203</td><td>bad</td></tr>
</table>

EXAMPLE 3

Procedure of Examples 1 was repeated but a film forming apparatus shown in FIG. 6 was used (totally four targets of Ti and AlD were used) and a laminated film was prepared from the same material under the same conditions as Sample No. 118 (TiN layer=2.5 nm and AlN layer=2.4 nm).

The flank wear of this Example was 0.100 mm.

EXAMPLE 4

Procedure of Example 1 was repeated but the content (vol %) of CBN in the substrate and compositions (wt %) of binder were changed to those shown in Table 5. X-ray diffraction patterns of the resulting sintered articles revealed existence of inevitable contaminations which were thought to be α-$Al_2O_3$, WC and Co.

The resulting CBN sintered body was shaped into a tip for cutting tool and an intermediate layer of TiN having a thickness of 2 μm was deposited on portions of the tip where cutting participate by usual PVD technique and then the ultrafine particle-layered film consisting of TiN and AlN deposited alternatively to the total thickness of 5.3 μm. TiN layer had a thickness of 2.5 nm and AlN layer had a thickness of 2.4 nm. In operation, the film forming apparatus shown in FIG. 5 was used.

Table 5 shows time until damage (=a time duration until the tool was damaged: min) which was determined when a round steel rod of carburized hardened SCM415 was cut by the resulting tools along its periphery.

TABLE 5

<table>
<tr><th>Sample<br>No</th><th>CBN<br>(vol %)</th><th>Composition of binder<br>(% by weight)</th><th colspan="2">Time until<br>rupture (min)</th></tr>
<tr><th></th><th></th><th></th><th>no<br>film[1]</th><th>with<br>film[2]</th></tr>
<tr><td>201</td><td>35</td><td>80:(TiHf)C, 20:$TiB_2$, AlN, $ASlB_2$</td><td>15</td><td>21</td></tr>
<tr><td>202</td><td>70</td><td>78:(TiW)N, 22:AlN, $AlB_2$, $TiB_2$</td><td>30</td><td>38</td></tr>
<tr><td>203</td><td>95</td><td>80:TiCN, 10:WC, 10:$TiB_2$, AlN</td><td>10</td><td>17</td></tr>
<tr><td>204</td><td>45</td><td>70:CoWC, $Co_3W_3B$, 30:AlN, $AlB_2$</td><td>20</td><td>30</td></tr>
<tr><td>205</td><td>80</td><td>80:CoWB, $Co_3W_3B$, 20:AlN</td><td>26</td><td>32</td></tr>
<tr><td>206</td><td>98</td><td>100:AlN</td><td>15</td><td>22</td></tr>
<tr><td>207</td><td>65</td><td>40:TiN, 20:VN, 20:HfC, 20:Aln, $TiB_2$</td><td>41</td><td>21</td></tr>
<tr><td>208</td><td>99</td><td>100:$Mg_2B_2N_4$, $Li_2B_2N_4$</td><td>15</td><td>18</td></tr>
<tr><td>209</td><td>60</td><td>100:$Al_2O_3$</td><td>1</td><td>3</td></tr>
<tr><td>210</td><td>20</td><td>60:TiN, 40:$AlB_2$, $TiB_2$</td><td>7</td><td>10</td></tr>
<tr><td>211</td><td>50</td><td>80:Cu, 20:TiN</td><td>3</td><td>6</td></tr>
</table>

Note
[1] tools before ultrafine particle-layered film is deposited.
[2] tools having ultrafine particle-layered film

EXAMPLE 5

A diamond sintered body was prepared from diamond powder, powder of iron family element, and powder of at least one of carbide or carbonitride of IVa, Va and VIa elements, WC, Si and SiC. The content of diamond and combination of powders are summarized in Table 6. Material powder mixture was sintered at 1,500° C. under a pressure of 60 kb for 30 minutes in a container of Mo. The resulting sintered article was shaped into a tip for cutting tool.

On portions of the tip where cutting participate, an intermediate layer of TiC (3 μm) was deposited by the same method is Example 2 and then TiN layer and AlN layer were deposited alternately by the same method as Example 2 to obtain ultrafine particle-layered film (thickness of 5.2 μm). Thickness of each layer was 2.5 nm and the lamination cycle was 5.0 nm. Operation was carried out in the apparatus shown in FIG. 5.

The resulting tips were evaluated by cutting test in which a round steel rod prepared by a combination of FCD 600 and 16% Si—Al alloy (cutting ratio=1:1) was cut along its periphery at a cutting speed of 200 mm/min, a depth of cut of 0.3 mm, a feed of 0.2 mm per revolution for 20 minutes in wet condition to measure a flank wear width (mm). Results are summarized in Table 6.

TABLE 6

| Sample No | content of diamond (vol %) | other components (% by weight) | Frank wear width (mm) | |
|---|---|---|---|---|
| | | | no film[1] | with film[2] |
| 301 | 45 | TiC, Co, WC | 0.187 | 0.143 |
| 302 | 70 | TiN, Co, Ni, WC | 0.171 | 0.120 |
| 303 | 95 | TiCN, Co, WC | 0.162 | 0.113 |
| 304 | 75 | SiC, Si, WC | 0.243 | 0.175 |
| 305 | 80 | Co, Ni, TiC | 0.159 | 0.212 |
| 306 | 98 | Co, WC | 0.208 | 0.156 |
| 307 | 85 | TiC, HfC, Co | 0.158 | 0.128 |
| 308 | 88 | TiC, Co, WC | 0.147 | 0.107 |
| 309 | 70 | Al, Al$_2$O$_3$ | 3 min (broken) | 5 min (broken) |
| 310 | 35 | TiN, Co | 2 min (broken) | 6 min (broken) |
| 311 | 99 | Co, W | 3 min (broken) | 5 min (film peeled off) |

Note
[1] tools before ultrafine particle-layered film is deposited.
[2] tools having ultrafine particle-layered film

EXAMPLE 6

A silicon nitride sintered body was prepared from a powder mixture of silicon nitride powder, aluminium oxide powder and yttrium oxide powder mixed at proportions by volume of 95:3:2. The powder mixture was sintered by HIP technique at 1,800° C. under a pressure of 300 kg/cm³ for 30 minutes in N$_2$ gas atmosphere. The resulting sintered article was shaped into a tip for cutting tool.

On portions of the tip where cutting participate, an intermediate layer of TiN (2 μm) was deposited by CVD technique and then TiN layer (2.5 nm) and AlN layer (2.4 nm) were deposited alternately by the same method as Example 2 to obtain ultrafine particle-layered film (thickness of 7.9 μm). Operation was carried out in the apparatus shown in FIG. 5.

The resulting tips were evaluated by cutting test in which a round steel rod (FC25) was cut along its periphery at a cutting speed of 300 mm/min, a depth of cut of 3 mm, a feed of 0.4 mm per revolution for 15 minutes in dry condition to obtain following flank wear width (mm).

| Tip tested (silicon nitride sintered body) | Flank wear width (mm) |
|---|---|
| having no ultrafine particle-layered film | 0.185 |
| having ultrafine particle-layered film | 0.112 |

EXAMPLE 7

A aluminium oxide-titanium carbide sintered body was prepared from a powder mixture of aluminium oxide powder, titanium carbide powder and yttrium oxide powder mixed at proportions by volume of 70:29.5:0.5. The powder mixture was sintered at 1,800° C. for 30 minutes. The resulting sintered article was shaped into a tip for cutting tool.

On portions of the tip where cutting participate, an intermediate layer of TiN (3 μm) was deposited by PVD technique and then TiN layer (2.5 nm) and AlN layer (2.4 nm) were deposited alternately (lamination cycle is 2.4 nm) by the same method as Example 2 to obtain ultrafine particle-layered film (thickness of 6.1 μm). Operation was carried out in the apparatus shown in FIG. 5.

The resulting tips were evaluated by cutting test in which a round Inconel rod (aging treated material: HRC45) was cut along its periphery at a cutting speed of 400 mm/min, a depth of cut of 1.0 mm, a feed of 0.15 mm per revolution for 10 minutes in wet condition to obtain following flank wear width (mm).

| Tip tested (aluminum oxide-titanium carbide sintered body) | Flank wear width (mm) |
|---|---|
| having no ultrafine particle-layered film | 0.215 |
| having ultrafine particle-layered film | 0.098 |

We claim:

1. Ultrafine particle-layered film, wherein said film has more than two layers made of ultrafine particles of a different compound consisting mainly of a carbide, nitride, carbonitride, or oxide of at least one element selected from a group consisting of IVa group elements, Va group elements, VIa group elements, Al, Si, and B.

2. Ultrafine particle-layered film set forth in claim 1 wherein a thickness of each layer is in a range of 1 nm to 100 nm.

3. Ultrafine particle-layered film set forth in claim 2 wherein the thickness of each layer is in a range of 1 nm to 50 nm.

4. Ultrafine particle-layered film set forth in claim 3 wherein a thickness of each layer is in a range of 1 nm to 10 nm.

5. Ultrafine particle-layered film set forth in claim 1 wherein the particle sizes of each layer are in a range of 1 nm to 100 nm.

6. Ultrafine particle-layered film set forth in claim 1 wherein the particle sizes of each layer are in a range of 1 nm to 50 nm.

7. Ultrafine particle-layered film set forth in claim 1 wherein the particle sizes of each layer are in a range of 1 nm to 10 nm.

8. Ultrafine particle-layered film set forth in claim 1, wherein said layers are alternating and repeating.

9. Ultrafine particle-layered film set forth in claim 1 wherein at least one layer is made of a compound whose crystal structure is cubic system and at least another one layer is made of a compound whose crystal structure is not cubic system and/or is amorphous.

10. Ultrafine particle-layered film set forth in claim 9 wherein at least one layer is made of a compound whose crystal structure is cubic system and at least another one layer is made of a compound whose crystal structure is hexagonal system.

11. Ultrafine particle-layered film set forth in claim 9 wherein said compound whose crystal structure is cubic system is nitride, carbide or carbonitride containing at least one element selected from a group consisting of Ti, Zr, Cr, V, Hf, AlD and B.

12. Ultrafine particle-layered film set forth in claim 9 wherein said compound whose crystal structure is not cubic system and/or is amorphous is nitride, carbide or carbonitride containing at least one element selected from a group consisting Al, Si and B.

13. Ultrafine particle-layered film set forth in claim 12 wherein said compound whose lattice structure is not cubic system and/or amorphous is AlN.

14. Ultrafine particle-layered film set forth in claim 1 wherein a composition modulated layer in which composition change gradually and continuously is interposed between adjacent two layers.

15. A method for making a coated tool, comprising applying on at least a portion of a surface of a substrate of said tool where cutting is to be effected said ultrafine particle-layered film.

16. The method set forth in claim 15 wherein said substrate is a CBN sintered body containing more than 20% by volume of cubic boron nitride (CBN), diamond sintered body containing more than 40% by volume of diamond, silicon nitride sintered body or aluminium oxide-titanium carbide sintered body.

17. The method set forth in claim 15 wherein said substrate is cemented carbide, cermet or high speed steel.

18. The method set forth in claim 15 wherein a thickness of said ultrafine particle-layered film is 0.5 μm to 15 μm.

19. The method set forth in claim 18 wherein said substrate is a CBN sintered body containing 30 to 90% by volume of cubic boron nitride (CBN), the remaining part of said CBN sintered body being a binder consisting of at least one member selected from the group consisting of nitride, carbide, boride and oxide of IVa, Va and VIA elements and their solid solutions and aluminium compounds and inevitable impurities.

20. The method set forth in claim 19 wherein said binder comprises 50 to 98% by weight of at least one member selected from a group consisting of TIC, TiN, TiCN, (TiM) C, (TiM)N and (TiM)CN in which M is a transition metal selected from IVa, Va nd VIa elements except Ti, and 2 to 50% by weight of aluminium compound.

21. The method set forth in claim 20 wherein said binder consists of 50 to 98% by weight of TiN, 2 to 50% by weight of aluminium compound and inevitable impurities.

22. The method set forth in claim 18 wherein said substrate is a CBN sintered body containing 40 to 95% by volume of cubic boron nitride (CBN), the remaining part of said CBN sintered body being a binder selected from the group consisting of TiN, boride or carbide of Co or W, aluminum nitride, aluminum boride and their solid solutions and inevitable impurities.

23. The method set forth in claim 22 wherein said binder contains 1 to 50% by weight of TiN and at least one member selected from the group consisting of boride and carbide of Co or W, aluminum nitride, aluminum boride and their solid solutions.

24. The method set forth in claim 18 wherein said substrate is a CBN sintered body containing more than 90% by volume of cubic boron nitride (CBN), the remaining part of said CBN sintered body being a binder comprising boride of Ia or IIa elements, TiN and inevitable impurities.

25. The method set forth in claim 24 wherein said binder contains 1 to 50% by weight of TiN and boronitride of Ia or IIa elements.

26. The method set forth in claim 18 wherein said substrate is a diamond sintered body containing 50 to 98% by volume of diamond, the remaining part of said sintered body comprising an iron family element and inevitable impurities.

27. The method set forth in claim 18 wherein said substrate is a diamond sintered body containing 60 to 95% by volume of diamond, the remaining part of said sintered body comprising an iron family element, at least one carbide or carbonitride of IVa, Va and VIa elements, WC and inevitable impurities.

28. The method set forth in claim 27 wherein said reminding part of said diamond sintered body comprises Co, TiC, WC and inevitable impurities.

29. The method set forth in claim 18 wherein said substrate is a diamond sintered body containing 60 to 98% by volume of diamond, the remaining part of said diamond sintered body comprising silicon carbide, silicon, WC and inevitable impurities.

30. The method set forth in claim 18 wherein said substrate is a sintered body containing more than 90%by volume of silicon nitride, the remaining part of said sintered silicon nitride body comprising at least one member selected from the group consisting of aluminum oxide, aluminum nitride, yttrium oxide, magnesium oxide, zirconium oxide, hafnium oxide, rear earth elements, TiN and TiC; and inevitable impurities.

31. The method set forth in claim 18 wherein said substrate is a sintered body made of 20 to 80% by volume of aluminum oxide and 75 to 15% by volume of titanium carbide, the remaining part of said sintered silicon nitride body comprising an oxide of at least one element selected from the group consisting of Mg, Y, Ca, Zr, Ni and Ti; and inevitable impurities.

* * * * *